(12) United States Patent
Stepniak et al.

(10) Patent No.: US 10,104,764 B2
(45) Date of Patent: Oct. 16, 2018

(54) ELECTRONIC DEVICE PACKAGE WITH VERTICALLY INTEGRATED CAPACITORS

(71) Applicants: Texas Instruments Incorporated, Dallas, TX (US); Texas Instruments Deutschland GmbH, Freising (DE)

(72) Inventors: Frank Stepniak, Allen, TX (US); Anton Winkler, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 788 days.

(21) Appl. No.: 14/218,523

(22) Filed: Mar. 18, 2014

(65) Prior Publication Data

US 2015/0271913 A1    Sep. 24, 2015

(51) Int. Cl.
 *H01H 9/28* (2006.01)
 *H05K 1/02* (2006.01)
 *H05K 1/16* (2006.01)
 *H05K 1/18* (2006.01)

(52) U.S. Cl.
 CPC .......... *H05K 1/0231* (2013.01); *H05K 1/162* (2013.01); *H05K 1/185* (2013.01); *H05K 1/0233* (2013.01); *H05K 1/181* (2013.01); *H05K 2201/1003* (2013.01)

(58) Field of Classification Search
 CPC ....... H05K 1/0231; H05K 1/181; H05K 1/185
 USPC ........................................................ 361/270
 See application file for complete search history.

(56) References Cited

U.S. PATENT DOCUMENTS

| | | | |
|---|---|---|---|
| 5,847,951 A * | 12/1998 | Brown | H01L 25/18 257/E25.031 |
| 6,335,564 B1 | 1/2002 | Pour | |
| 6,362,525 B1 | 3/2002 | Rahim | |
| 6,621,140 B1 | 9/2003 | Gibson et al. | |
| 6,713,676 B2 | 3/2004 | Fischer | |
| 6,859,129 B2 * | 2/2005 | Tsai | H01F 17/0033 257/E27.046 |
| 6,888,227 B2 | 3/2005 | Slupe et al. | |
| 6,885,278 B2 | 4/2005 | Nakao et al. | |
| 7,139,160 B2 | 11/2006 | Hidaka et al. | |
| 7,279,391 B2 * | 10/2007 | Hsu | H01F 17/0033 257/531 |
| 8,502,372 B2 * | 8/2013 | Osenbach | H01L 23/36 257/704 |

(Continued)

OTHER PUBLICATIONS

Texan Instrument, Design Summary for MicroSiP-enabled TSP8267xSiP, 2011, pp. 1-7.*

(Continued)

*Primary Examiner* — Thienvu Tran
*Assistant Examiner* — Lucy Thomas
(74) *Attorney, Agent, or Firm* — Dawn Jos; Charles A. Brill; Frank D. Cimino

(57) ABSTRACT

A system-in-a-package (SIP) has a semiconductor chip embedded in a dielectric substrate. An inductor is on a top surface of a substrate and is connected to the semiconductor chip. A thin film capacitor may be placed between the inductor and the dielectric substrate. A second thin film capacitor may be placed on the top surface of the semiconductor chip, or be embedded in the dielectric substrate with a thermal pad on a bottom surface of the substrate which is connected to the second thin film capacitor to facilitate heat dissipation.

20 Claims, 1 Drawing Sheet

(56) References Cited

U.S. PATENT DOCUMENTS

| | | | | |
|---|---|---|---|---|
| 2003/0179550 A1* | 9/2003 | Nebrigic | ................ | H01L 23/04 361/729 |
| 2004/0033654 A1* | 2/2004 | Yamagata | ............... | H01L 23/50 438/202 |
| 2005/0133240 A1 | 6/2005 | Hidaka et al. | | |
| 2005/0258447 A1* | 11/2005 | Oi | ....................... | H01L 23/5389 257/100 |
| 2006/0108663 A1* | 5/2006 | Sanzo | ..................... | G06F 9/544 257/531 |
| 2006/0245308 A1* | 11/2006 | Macropoulos | ......... | H05K 1/024 369/1 |
| 2008/0137315 A1* | 6/2008 | Takaike | ............... | H05K 3/4015 361/771 |
| 2009/0073667 A1* | 3/2009 | Chung | ................ | H01L 23/3114 361/763 |
| 2009/0230531 A1* | 9/2009 | Do | .......................... | H01L 21/56 257/685 |
| 2009/0267220 A1* | 10/2009 | Kuhlman | ............ | H01L 23/3121 257/698 |
| 2010/0059854 A1* | 3/2010 | Lin | ........................ | H01L 25/16 257/528 |
| 2010/0133670 A1* | 6/2010 | Liu | ................... | H01L 23/49524 257/675 |
| 2011/0050334 A1* | 3/2011 | Pan | ....................... | H01L 23/642 327/564 |
| 2011/0163161 A1* | 7/2011 | Tiggelman | ........... | G06K 7/0008 235/439 |
| 2011/0193491 A1* | 8/2011 | Choutov | ............ | H05B 33/0803 315/291 |
| 2012/0049353 A1* | 3/2012 | Osenbach | ............... | H01L 23/36 257/737 |
| 2012/0326287 A1* | 12/2012 | Joshi | ................. | H01L 23/49548 257/676 |
| 2013/0056882 A1* | 3/2013 | Kim | ........................ | H01L 23/16 257/777 |
| 2013/0221526 A1* | 8/2013 | Lange | ..................... | H01L 21/50 257/750 |
| 2014/0021552 A1* | 1/2014 | Wang | ................... | H01L 29/6653 257/368 |
| 2015/0061103 A1* | 3/2015 | Manack | ............. | H01L 23/5389 257/698 |
| 2015/0170835 A1* | 6/2015 | Beer | ................... | H01F 41/0206 336/192 |
| 2015/0216054 A1* | 7/2015 | Standing | ............. | B23K 1/0016 361/761 |
| 2015/0255490 A1* | 9/2015 | Miyairi | ............... | H01L 27/1207 257/43 |

OTHER PUBLICATIONS

3D Packaging, Magazine on DIC, TSV< WLP & Embedded die Technologies, May 2012, pp. 1-24.*

Ti MicroSIP package—First high volume embedded die package, Mar. 2012, p. 1.*

"Design Summary for MicroSiP™-enabled TPS8267xSiP", Texas Instruments 1Q 2011 MicroSiP™ Design Summary SLIB006 published 2011.

Romain Fraux, "Texas Instruments' Embedded Die Package", Systems Plus Consulting, May 2012, Issue No. 23 of 3D Packaging.

Artesyn Technologies, PTH03010 3.3Vin single output DC/DC converter data sheet, (p. 4) pth03010.pdf Rev(05): Sep. 30, 2004.

* cited by examiner

US 10,104,764 B2

ELECTRONIC DEVICE PACKAGE WITH VERTICALLY INTEGRATED CAPACITORS

FIELD

Disclosed embodiments are directed to electronic device packages, and more specifically to electronic device packages with vertically integrated capacitors.

BACKGROUND

Electronic device packages come in many forms. Some contain elements such as inductors, capacitors, and integrated circuit (IC) chips. There are electronic device packages that integrate a complete electronic system, often referred to as a system-in-a-package (SIP). A SIP usually has a dielectric substrate, which is a single layered or multi-layered slab of dielectric material with a conductive wiring circuit built in it. Some substrates may contain IC chips connected by the conductive wiring circuit with through-holes between the multiple layers.

Traditionally, in a SIP that has a substrate, one side of the substrate (the bottom surface) is designed for connecting the package to the outside world, for example a mother board, and the other side (the top surface) is designed for the placement of various circuit elements. The circuit elements are connected to form the electronic system by the conductive wiring circuit in the substrate or with additional metal wires. One example of a SIP is a switching power converter.

The modern switching power converter comprises at least an integrated IC with both power and controller functions, an input capacitor, an output capacitor, and an inductor. The package has an input lead ($V_{IN}$), an output lead ($V_{OUT}$), a ground lead (GND), plus other leads for functions such as enabling, mode selection and output voltage sensing. The input capacitor is connected to the $V_{IN}$ lead, GND, and the controller chip; and the output capacitor is connected to $V_{OUT}$ lead, GND and the controller chip. This power system enables a precise, regulated output voltage starting from a poorly controlled input voltage as power is rapidly added and subtracted from the inductor. The main advantage of this arrangement is highly efficient electrical power conversion in a small format. A disadvantage is the generation of electromagnetic interference and noise due to high frequency switching. The capacitors provide low-pass filtering.

In a traditional build-up, the controller chip, the inductor, and the capacitors are all placed side-by-side on the substrate. In a more advanced SIP, the controller chip may be embedded in the substrate so that only the inductor and the capacitors are on the surface of the substrate. One embeddable package is known as PICOSTAR by Texas Instruments Incorporated which allows embedding of components such as semiconductor chips inside the printed circuit board (PCB) in order to minimize the board space.

SUMMARY

This Summary is provided to introduce a brief selection of disclosed concepts in a simplified form that are further described below in the Detailed Description including the drawings provided. This Summary is not intended to limit the claimed subject matter's scope.

In this Application, terms follow conventional definitions known to persons having ordinary skilled in the art of semiconductor device packaging. Moreover, in this Application, when the terms "attached", "attachment", and "attaching" are used, they are to be construed as two components adhered to each other by solder or other adhesive without any intervening component in between. When the term "electrically connected" or "connecting" is used, it is to be construed as two electrical components connected by a wire, solder, conductive paste, metallic element, and with no intervening electrical component in between.

Disclosed embodiments recognize that there are deficiencies in modern electronic device packages that hinder the performance of the electronic device and keep the size of the packages large and cost of manufacturing high. One disclosed embodiment is a strategically designed substrate that enables the placement of a thin film capacitor, such as an input capacitor, under an inductor, and connecting the capacitor to a controller chip using microvias, thus reducing the size of the substrate and the distance between the capacitor and the controller chip.

Another disclosed embodiment includes placing the input capacitor directly on the top surface of the controller chip and within the dielectric substrate, thus further reducing the distance between the input capacitor and the controller chip. Another disclosed embodiment includes placing a capacitor, such as the output capacitor, directly on the bottom surface of the controller chip and within the dielectric substrate, thus reducing the distance between the capacitor and the controller chip. Yet another disclosed embodiment includes placing a thermal pad adjacent to a capacitor at the bottom surface of the dielectric substrate, thus enhancing the heat dissipation rate of the package.

BRIEF DESCRIPTION OF THE DRAWINGS

Reference will now be made to the accompanying drawings, which are not necessarily drawn to scale, wherein.

DETAIL DESCRIPTION

Figure 1:
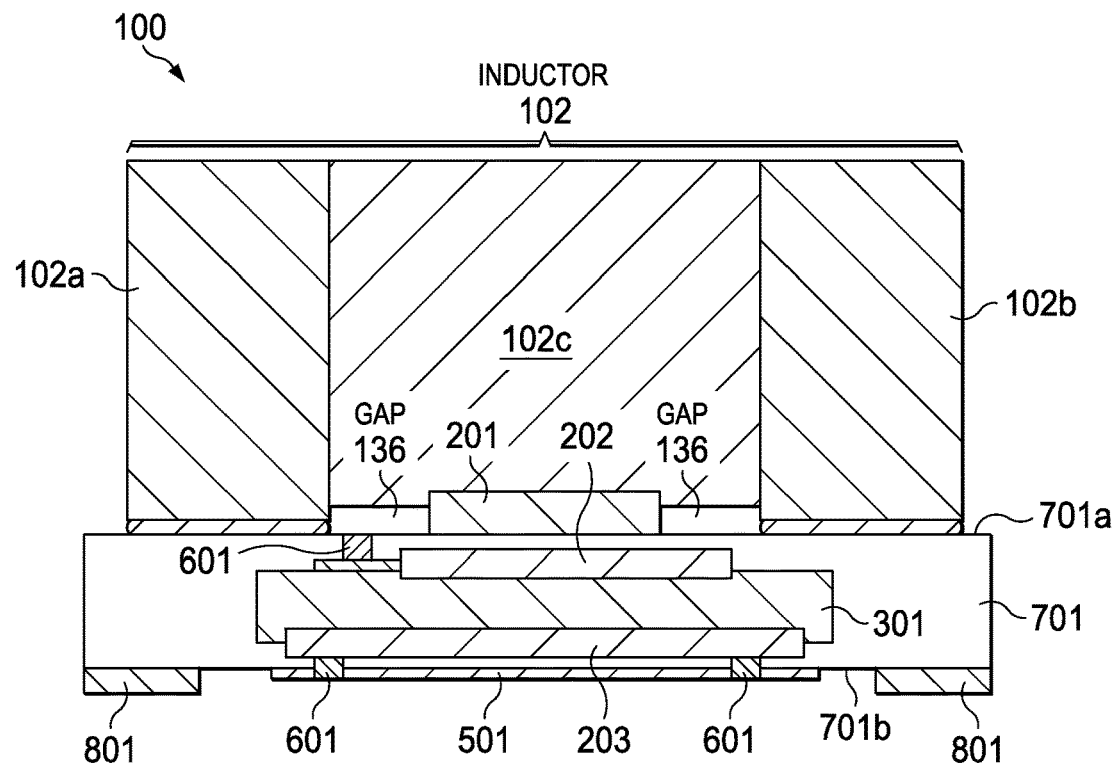
FIG. 1 depicts a cut-away view of an example system-in-a-package (SIP), according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 depicts an example SIP 100 (hereafter package 100) that embodies several disclosed aspects. The package 100 is described as being a voltage converter. The voltage converter includes a controller chip 301, a capacitor 201 attached to a top surface 701a of the dielectric substrate 701, a capacitor 203 attached to a bottom surface of the controller chip 301, and a capacitor 202 attached to the top surface of the controller chip 301. The controller chip 301 and the capacitors 203 and 202 are embedded within the dielectric substrate 701.

The voltage converter also includes an inductor 102 which comprises a body portion 102c between end portions 102a and 102b that includes metallization which allows soldering to metal on the top surface 701a of the dielectric substrate 701. Body portion 102c overhangs the capacitor 201 and is attached by its end portions 102a and 102b to the top surface of the dielectric substrate 701. Inductor 102 can be an off-the-shelf inductor. There is a dielectric material between the body portion 102c and the top of the capacitor 201, such as when the capacitor 201 includes an epoxy where only its two electrodes are exposed.

Even though FIG. 1 depicts capacitors 201 and 203, in practice, depending on the design, one of these two capacitors may be absent. Generally, the capacitors are of the thin film type, which may have a thickness of less than 0.02 mm.

The inductor 102 is generally of the surface mount type. The end portions 102a and 102b of the inductor 102 may be attached to metal on the top surface 701a of the dielectric substrate 701, wherein there is a gap 136 between the body portion 102c of the inductor 102 and the top surface 701a of the dielectric substrate 701 to accommodate the capacitor 201.

The dielectric substrate 701 may comprise epoxy resin and fiber or a ceramic material. The dielectric substrate 701 may be single layered or laminated with multiple layers with conductive wiring patterns built between layers and connected with filled vias (also referred to as filled throughholes) 601. The dielectric substrate 701 may have pad of electrically conductive material on the top surface 701a and/or bottom surface 701b for connecting to electrical components.

The package 100/voltage converter depicted in FIG. 1 can be a quad-flat no-lead (QFN) package with its leads 801 on the bottom surface 701b of the dielectric substrate 701. Depending on other design consideration, the voltage converter may also be packaged with leads extending beyond the edges of the dielectric substrate 701.

Figure 2:
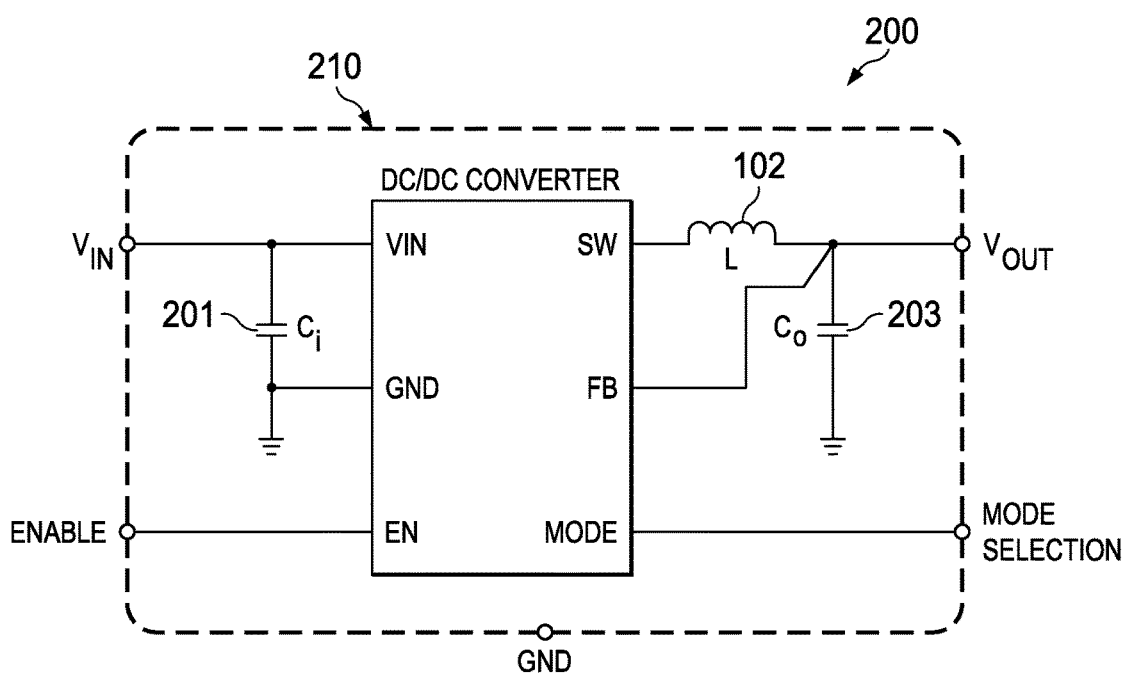
FIG. 2 depicts an example electrical schematic of an example packaged DC/DC voltage converter that can embody disclosed aspects.

The package 100 embodied as a voltage converter receives voltage from an outside voltage source such as a battery or a wall socket at its $V_{IN}$ lead, and delivers a constant voltage output to a load at its $V_{OUT}$ lead (see FIG. 2 described below). The voltage input at $V_{IN}$ may vary with time but the voltage at $V_{OUT}$ is generally specified to be stable within a specific relatively narrow range.

The function of converting a time varying input voltage into a stable output voltage is accomplished by a voltage converter in a package that embodies several disclosed aspects. Disclosed aspects enables the voltage converter package to be smaller, more cost effective, and perform better as compared to conventional voltage converters.

One disclosed aspect includes placing capacitor 201 embodied as a thin film capacitor directly under the body portion 102c of the inductor 102 and above the dielectric substrate 701 without altering the placement of the inductor 102. The capacitor 201 can be attached to the conductive wiring pattern on the top surface 701a of the dielectric substrate 701 with adhesives such as solder or conductive paste and can be directly connected to the $V_{IN}$ terminal of the controller chip 301. This placement is recognized to be advantageous because this places the capacitor 201 at close proximity to the controller chip 301 and thus reducing the parasitic inductance of the electrical connection and, as a consequence the operation frequency of the voltage converter may be raised. In the example package 100/voltage converter depicted in FIG. 1, as noted above, capacitor 201 is not electrically connected to the inductor 102 due to a dielectric being in between.

Another disclosed aspect depicted in FIG. 1 is having capacitor 202 shown as a thin film capacitor directly attached to the top surface of the controller chip 301. The top surface of the controller chip 301 has, in this voltage converter embodiment, a $V_{IN}$ pad and a GND pad. The location of the pads of the controller chip 301 may be laid out so that the two terminals of the thin film capacitor 202 can be directly attached to the pads with adhesives such as using solder or conductive paste. The placement of an input capacitor shown as capacitor 202 directly on the controller chip 301 surface minimizes the connection path length between the controller chip 301 and the input capacitor. Minimizing the connection path length between the controller chip 301 and the input capacitor is not achievable without applying this disclosed aspect.

Another disclosed aspect depicted in FIG. 1 is embedding a capacitor 203 in the dielectric substrate 701 directly on the bottom surface of the controller chip 301. In this embodiment of the voltage converter, the capacitor 203 is an output capacitor positioned between the $V_{OUT}$ terminal and the GND potential point, where $V_{OUT}$ is connected to the output side of the inductor 102 and to the FB (Feedback) terminal (see FIG. 2 described below). This arrangement has the function of smoothing the pulsed output voltage from the controller chip 301 provided as $V_{IN}$ to the voltage converter into a DC voltage ($V_{OUT}$) to power a load.

The capacitor 203 may be attached to the controller chip 301 with solder or conductive paste if the bottom surface of the controller chip 301 is at ground point during operation. Otherwise, the capacitor 203 may be attached to the controller chip 301 with electrically non-conductive (dielectric) adhesives such as an epoxy resin. The capacitor 203 as depicted in FIG. 1 is further attached to the thermal pad 501 by filled vias 601 that function as thermal vias. The disclosed placement of the capacitor 203 as an output capacitor not only enables a reduction in the size of the package 100 previously unknown, but also creates a thermal path from the controller chip 301 to the outside of the package so that heat generated during the operation of the power converter is more easily dissipated.

The controller chip 301 depicted in FIG. 1 may be a semiconductor chip comprising silicon. Alternatively, the controller chip 301 may comprise or other semiconductor substrate materials such as germanium, silicon carbide, gallium nitride, or germanium doped silicon.

The package 100/power converter depicted in FIG. 1 may function as depicted, or may be further encapsulated with plastic that encloses the inductor, the capacitors, with only the leads exposed for further connection. FIG. 2 depicts an electrical schematic of an example packaged DC/DC voltage converter 200 that can embody disclosed aspects including a thin film capacitor positioned on a semiconductor chip and under an inductor as shown in FIG. 1. Plastic material 210 is shown inside the dashed line depicted in FIG. 2 which encloses the inductor 102, the capacitors shown as an input capacitor $C_i$ 201 and output capacitor $C_o$ 203, with only the $V_{IN}$, Enable, Mode Selection, $V_{OUT}$ and GND leads exposed from the package for external connection. A controller chip (not shown in FIG. 2 that can be positioned within the dielectric substrate 701 as controller chip 301 shown in FIG. 1) provides the input signal to the $V_{IN}$ lead shown. In one particular embodiment, $V_{IN}$ may range from 2.3 V to 4.8 V, and $V_{OUT}$ may be about 1.8 V at 600 mA.

Disclosed embodiments include processes for forming disclosed electronic device packages. One embodiment comprises attaching and electrically connecting a surface mount inductor having a body portion, and a first end portion and a second end portion to a dielectric substrate; and placing a thin film capacitor between the inductor and dielectric substrate. The process can further comprise embedding a semiconductor chip in the dielectric substrate; and connecting an input terminal on the semiconductor chip electrically to the thin film capacitor, and connecting an input terminal on the semiconductor chip electrically to the thin film capacitor.

Another process embodiment comprises a process comprising embedding a semiconductor chip having a top surface and a bottom surface in a dielectric substrate with a thin film capacitor attaching to the top surface (active side) of the semiconductor chip. The semiconductor chip can have a surface portion to which a second thin film capacitor is attached. The process can further comprise thermally directly connecting the second thin film capacitor to a thermal pad which is on the bottom surface of the substrate. The process can also include attaching and electrically connecting a surface mount inductor having a body portion, and a first end portion and a second end portion to the top surface of said dielectric substrate, and encapsulating the surface mount inductor, the semiconductor chip, and the first thin film capacitor and second thin film capacitor in a plastic material to provide a plastic electronic device package. The process can further comprise exposing a thermal pad on the bottom side of the dielectric substrate from an outer surface of the plastic material.

Disclosed electronic device packages being embedded die packages can utilize known embedded package processing. One such embedded die package and associated processing is provided by Texas Instruments Incorporated, which uses the term "microsystem package" and the trademark MicroSIP in referring to this product. Embedded die packages and associated processing are described in detail in "Design Summary for MicroSiP™-enabled TPS8267xSiP", Texas Instruments 1Q 2011 MicroSiP™ Design Summary SLIB006 published 2011, and in "Texas Instruments' Embedded Die Package" by Romain Fraux from Systems Plus Consulting, May 2012, Issue N 23 of 3D Packaging, which are both hereby incorporated by reference.

In brief, MICROSIP construction is accomplished by first adhering a PicoStar-configured IC onto a reinforced thin Cu film. A dielectric film composite of epoxy and glass weave is then laid over the IC followed by the application of a second Cu film. Electrical connections are made to the substrate layers via mechanically drilled and plated throughholes while IC connections to the substrate are created with laser holes and electro-electroless plating.

In one fabrication embodiment, capacitors are applied to the front and/or back of a PICOSTAR wafer with a non-conductive adhesive, where electrical interconnect is accomplished during the embedding process through laser hole creating and metal filling to both the PICOSTAR and the capacitor. In a different fabrication method, the capacitor is first electrically connected to the PICOSTAR wafer and electrical connection to the MICROSIP is only through the IC. The capacitor to PICOSTAR electrical interconnect may be made by well-established industrial practices, such as conductive adhesive or soldering.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A system in package (SIP) comprising:
   a substrate including a semiconductor chip and a first capacitor electrically connected to the semiconductor chip; the semiconductor chip and the first capacitor embedded within the substrate;
   an inductor electrically connected to the substrate, the semiconductor chip between the first capacitor and the inductor;
   a second capacitor embedded in the substrate, the second capacitor between the semiconductor chip and the inductor in a vertical direction, the vertical direction along a plane of a height of the semiconductor chip, the second capacitor electrically connected and mechanically attached to the semiconductor chip; and
   a plastic material covering portions of the substrate and the inductor.

2. The SIP of claim 1, wherein the first capacitor is attached to a horizontal surface of the semiconductor chip, the horizontal direction being along a length of the semiconductor chip.

3. The SIP of claim 1, wherein the first capacitor and the second capacitor have a thickness of less than 0.02 millimeters.

4. The SIP of claim 1, wherein the substrate includes multiple layers with conductive wiring patterns.

5. The SIP of claim 1, wherein the substrate includes a plurality of leads on one surface.

6. The SIP of claim 1, wherein the substrate includes a plurality of filled vias connected to the first capacitor.

7. The SIP of claim 5, wherein the substrate includes a thermal pad attached to the one surface.

8. The SIP of claim 7, wherein the thermal pad is thermally connected to the at least one capacitor.

9. The SIP of claim 1, wherein the first capacitor is attached to the semiconductor chip.

10. The SIP of claim 1, wherein the SIP is a quad flat no lead (QFN) package.

11. The SIP of claim 1, wherein the semiconductor chip is between the first capacitor and the inductor in a vertical direction, the vertical direction along a height of the semiconductor chip.

12. A system in package (SIP) comprising:
   a substrate including a semiconductor chip and a first capacitor embedded within the substrate, the first capacitor mechanically attached to the semiconductor chip;
   an inductor electrically connected to the substrate, the inductor including a body portion and two end portions, the two end portions electrically connected to the substrate, the body portion offset from the two end portions defining a gap; and
   a second capacitor in the gap and in between the body portion and the semiconductor chip in the substrate, the second capacitor in between the body portion and the semiconductor chip in a vertical direction, the vertical direction along a plane of a height of the semiconductor chip.

13. The SIP of claim 12 further comprising a plastic material covering portions of the substrate, the second capacitor, and the inductor.

14. The SIP of claim 12, wherein the substrate includes a plurality of leads at one surface.

15. The SIP of claim 12, wherein the substrate includes a plurality of filled vias connected to the first capacitor.

16. The SIP of claim 12, wherein the second capacitor has a thickness of less than 0.02 millimeters.

17. A system in package (SIP) comprising:
a substrate including a semiconductor chip and two capacitors attached to two opposite sides of the semiconductor chip, the semiconductor chip and the two capacitors embedded within the substrate, wherein the two capacitors are attached to two horizontal surfaces of the semiconductor chip, the two horizontal surfaces defined along a length of the semiconductor chip;
an inductor on a first surface of the substrate; and
a plastic material covering portions of the substrate and the surface mount inductor.

18. The SIP of claim 17 further comprising a thermal pad on an opposite second surface of the substrate.

19. The SIP of claim 17, wherein the inductor includes a body portion and two end portions, the two end portions electrically connected to the substrate, the body portion offset from the two end portions defining a gap.

20. The SIP of claim 19 further comprising a third capacitor in the gap and in between the substrate and the body portion.

* * * * *